United States Patent [19]

Abdalla et al.

[11] Patent Number: 4,670,097
[45] Date of Patent: Jun. 2, 1987

[54] METHOD FOR PATTERNING TRANSPARENT LAYERS ON A TRANSPARENT SUBSTRATE

[75] Inventors: Mohamed I. Abdalla, Beverly, Mass.; M. Robert Miller, Neptune, NJ

[73] Assignees: GTE Products Corporation, Danvers, Mass.; The United States of America as represented by the Secretary of the Army, Washington, D.C.

[21] Appl. No.: 812,703

[22] Filed: Dec. 23, 1985

[51] Int. Cl.[4] .......................... C23F 1/02; B44C 1/22; C03C 15/00; C03C 25/06
[52] U.S. Cl. .................... 156/659.1; 156/650; 156/656; 156/661.1; 156/667; 430/313; 430/318
[58] Field of Search ............ 156/650, 652, 654, 655, 156/656, 659.1, 661.1, 667; 430/313, 318, 323, 329

[56] References Cited

U.S. PATENT DOCUMENTS 3,979,240 9/1976 Ghezzo ..................... 156/667 X
4,188,095 2/1980 Nishimura et al. ............. 350/357
4,336,295 6/1982 Smith ......................... 428/195

FOREIGN PATENT DOCUMENTS 56-04174 1/1981 Japan ....................... 156/667

Primary Examiner—William A. Powell
Attorney, Agent, or Firm—José W. Jimenez; Martha Ann Finnegan

[57] ABSTRACT

An optically transparent and electrically conductive film is patterned on a substrate, for instance in an electro-optical display device such as an electroluminescent device having a patterned transparent electrode layer, by a process utilizing a double masking structure that provides for more positive delineation of thin film device patterns. In this process, an indium tin oxide layer is formed between a metallic pattern on a glass substrate and a photoresist mask. The indium tin oxide layer has a metal lift-off mask under those areas that are to be removed and a photoresist protective mask over those areas that are to remain. The double masking will also provide greater protection to the electrode areas during the critical etching steps in developing an electroluminescent display.

10 Claims, 10 Drawing Figures

METHOD FOR PATTERNING TRANSPARENT LAYERS ON A TRANSPARENT SUBSTRATE

The Government has rights in this invention pursuant to Contract No. DAAK20-83-C-0378 awarded by the Department of The Army.

TECHNICAL FIELD

The present invention relates in general to the preparation of electrode layers in a thin film device and more particularly to the preparation of transparent layers which are arranged in a pattern on a substrate for use in electroluminescent displays.

BACKGROUND

The transparent patterned electrically conducting electrodes of electro-optical displays (LCD, Electroluminescent) are generally supported on transparent support plates or substrates. The electrodes are usually prepared by first coating one surface of the substrate, for example, by vapor deposition or sputtering in vacuo, with a continuous thin film of a transparent, electrically conducted material, for example semiconductive metal oxide such as indium oxide and/or tin oxide, and then selectively removing portions of the deposited film by etching to produce an electrode pattern. As freshly deposited, that is without heat treatment, the vapor deposited or sputtered films can be etched relatively easily with acids. In order to confine the etching to selected areas, the film is covered with a photoresist, which is a layer of photopolymerizable material. The photoresist is then polymerized imagewise by exposure to actinic radiation. The unpolymerized resist in the unexposed areas can then be removed, for example by a suitable solvent, to form the windows of an etching mask. Subsequently, the uncovered areas of the transparent electrically conductive film are etched away, and the photoresist layer is removed from the covered areas of the transparent electrode film, which remain on the substrate (See U.S. Pat. No. 4,348,255). The photoresist etching process makes it possible to prepare very complex electrode patterns and those having very fine lines, especially in thin film electroluminescent displays which normally require delineation of a perfect pattern of hundreds of column electrodes over an area of thousands of square centimeters. However, the transparent electrode material is difficult to etch and the etchant (for example hydrochloric or hydrobromic acids) attacks both the photoresist etch mask and the glass substrate. The etching process also tends to leave sharp, ragged edges on the conductor patterns which produce weak areas in the subsequently deposited layers and eventually cause device breakdown. In addition, variability in glass substrate flatness, semiconductive metal oxide film thickness and photoresist thickness causes this process to require a great deal of technical judgment at critical steps and consistently results in electrode patterns that are not sufficiently delineated to be commercially acceptable.

Therefore, a need has continued to exist for a method of producing patterned transparent electrodes on substrates which avoid the problems introduced by known methods of etching.

SUMMARY OF THE INVENTION

It is, therefore, a primary object of this invention to enhance the art of preparing transparent electrodes for electro-optical displays by providing a method that leads to double masking structure for more positive delineation of thin film film device patterns.

In accordance with one aspect of this invention, there is provided a method of patterning electrically conductive layers on a substrate. This method comprises the steps of providing a substrate having a metallic material pattern thereon, heating the substrate and depositing a layer of electrically conductive material over the metallic pattern and on the substrate. A layer of photoresist composition is then deposited over the electrically conductive layer and is then exposed to ultraviolet light through the side of the substrate opposite the photoresist layer. Finally, the photoresist layer is developed to both form a photoresist mask and to expose portions of the electrically conductive material disposed over the metallic pattern.

In accordance with another aspect of this invention, there is provided a method of patterning electrically conductive layers on a substrate, the method comprising the steps of providing an optically transparent substrate coated with a layer of metallic material while coating the metallic layer with a layer of photoresist composition. The photoresist layer is exposed to ultraviolet light and is then developed to both form a photoresist mask and to expose portions of the metallic layer. In addition the exposed metallic portions are etched and the photoresist mask is removed resulting in a metallic pattern on the substrate. Next the substrate is heated and a layer of electrically conductive material is deposited on the substrate and over the metallic pattern. A layer of photoresist composition is then deposited over the electrically conductive layer and the photoresist layer is then exposed to ultraviolet light through the side of the substrate opposite the photoresist layer. Finally, the the photoresist layer is developed to both form a photoresist mask and to expose portions of the electrically conductive material disposed over the metallic pattern.

BRIEF DESCRIPTIONS OF THE DRAWINGS

BEST MODE FOR CARRYING OUT THE INVENTION

For a better understanding of the present invention together with other and further objects, advantages and capabilities thereof, reference is made to the following disclosure and appended claims in connection with the above described drawings.

Figure 1:
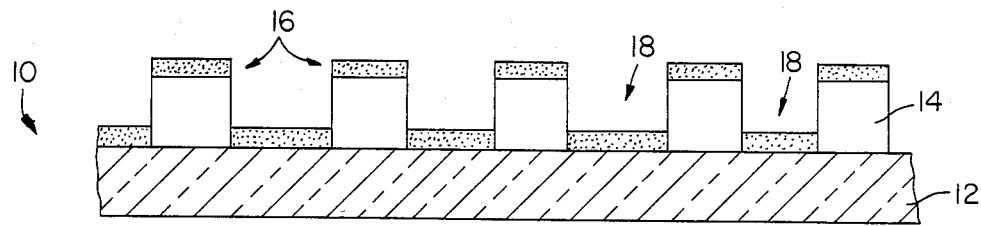
FIG. 1 illustrates an example of the known "lift-off" or rejection mask technique used to form the transparent electrode layers on a glass substrate.

One of the techniques that has been tried in the past to alleviate some of the problems involved with using an etching process to form electrode patterns in a thin film device has been the lift-off or rejection mask technique. As illustrated in FIG. 1 (prior art), a bare substrate glass 12 is coated with a photoresist composition that is then exposed to a form of radiation through a mask and developed to expose those areas where the transparent electrodes are to be located. In FIG. 1 the photoresist mask structure is shown as 14 and the areas between mask structure 14 are exposed portions of substrate 12. The semiconductive metal oxide material such as indium tin oxide, is then deposited over the entire substrate. The indium tin oxide on photoresist mask 14 are marked as 16 and where the electrodes are to be ultimately located are marked as 18. Subsequently, removal of the photoresist "lifts-off" the indium tin oxide from the areas between electrodes 18. One of the drawbacks with this approach is that the photoresist can not be exposed to high temperatures so the indium tin oxide must be put down cold, which causes it to have a high level of resistivity. The resistivity can be reduced by annealing the patterned indium tin oxide, but not to the level that it could be if the indium tin oxide were deposited on a hot substrate. Metals such as aluminum have been tried for the "lift-off" mask but etching the metal that is covered with the indium tin oxide is not a trivial problem and extreme care must be taken in the choice of an etchant, process steps and etch time to avoid damaging the electrodes while ensuring complete removal of all unwanted material.

Figure 2A:
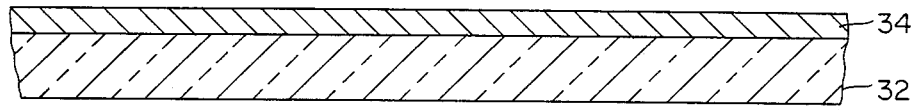
FIGS. 2a through 2f are illustrations that represent the steps of the etching process for patterning a metallic material on a glass substrate.
Figure 2B:
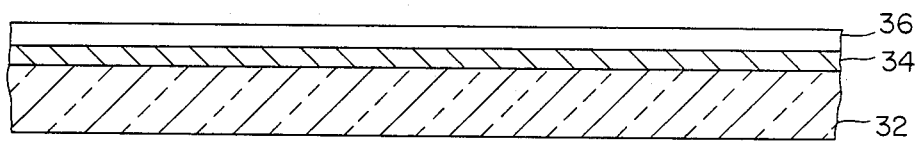
Figure 2C:
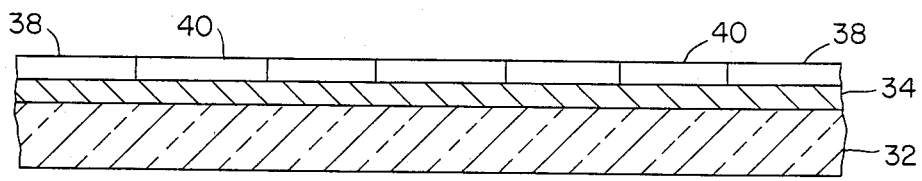
Figure 2D:
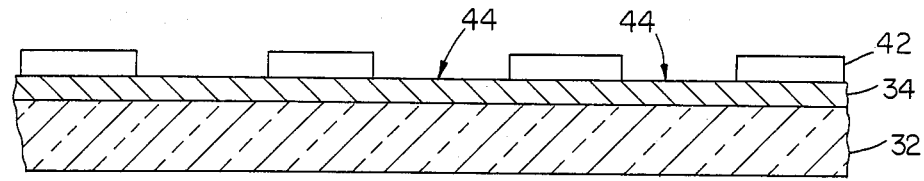
Figure 2E:
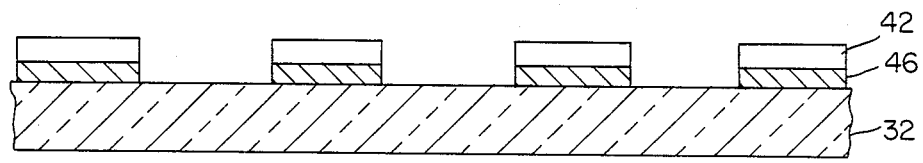

According to one embodiment of the present invention, the method for effectively patterning electrically conductive layers on a substrate, without undue complexity in utilizing such a method, will now be described herein with the aid of FIGS. 2 through 5. In FIG. 2a an optically transparent substrate or support layer 32, is provided having a layer of metallic material 34 deposited or coated thereon. FIG. 2b illustrates a layer of photoresist composition 36 that is applied to the metallic material layer 34. In FIG. 2c, photoresist layer 36 is exposed to ultraviolet light through a mask (not shown) so that the exposed areas 38 and unexposed areas 40 of photoresist layer 36 are formed. Photoresist layer 36 is then developed to form a photoresist mask 42 and expose portions 44 of metallic layer 34 as illustrated in FIG. 2d. In FIG. 2d photoresist mask 42 is shown on those parts of the metallic layer 34 which are not to be etched and portions 44 illustrate the exposed portions of the metal after removal of unexposed portions of the photoresist layer. FIG. 2e illustrates metallic areas 46 of metallic layer 34, which remain covered with mask 42 after exposed portions 44 (uncovered metallic areas) have been etched away. Photoresist mask 42 is then removed resulting in a metallic pattern 46 on substrate 32 as in FIG. 2f. The areas in between the metallic strips that form metallic pattern 46 are ultimately where the electrodes of the particular display device will be located.

Figure 2F:
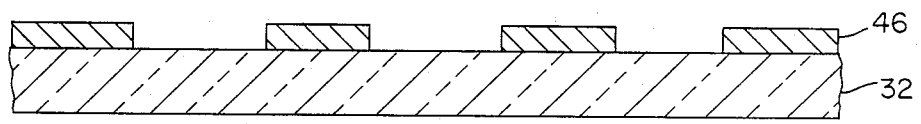
Figure 3:
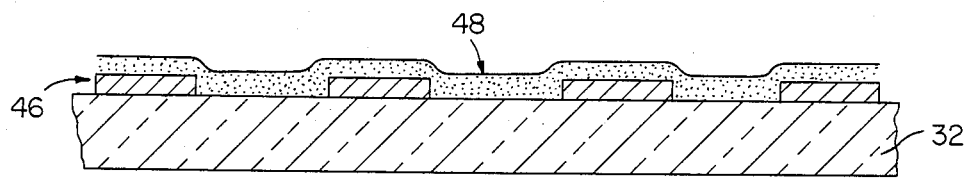
FIG. 3 illustrates a layer of semiconductive metal oxide material formed over a glass substrate having a metallic pattern thereon.
Figure 4:
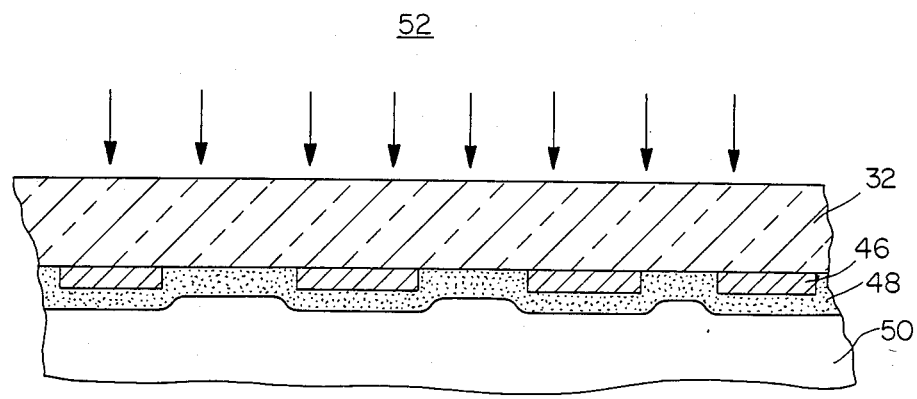
FIG. 4 illustrates a photoresist layer being exposed to ultraviolet light through the glass substrate opposite the photoresist layer.
Figure 5:
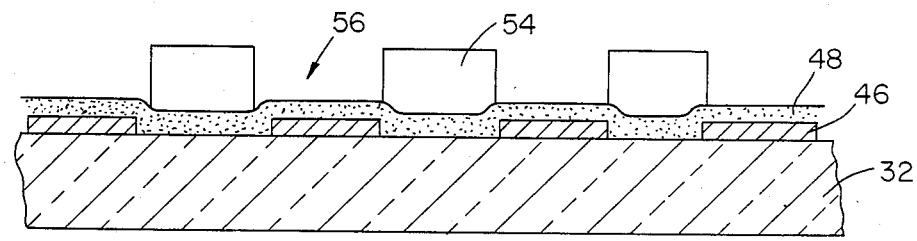
FIG. 5 illustrates the double masking structure which results when utilizing the method as described hereinafter.

The substrate 32 illustrated in FIG. 2f is heated and a layer of electrically conductive material is deposited on substrate 32 and over metallic pattern 46, resulting in the structure illustrated in FIG. 3. Next a layer of photoresist composition 50 is deposited over electrically conductive layer 48 resulting in the structure illustrated in FIG. 4 (turning 180°). Photoresist layer 50 is exposed to ultraviolet light 52 through the side of substrate 32 opposite photoresist layer 50. In this example the metallic pattern 46 will act as a mask to prevent certain portions of photoresist layer 50 from being exposed to ultraviolet light 52. Attenuation of ultraviolet light 52 through glass substrate 32 will require somewhat longer than normal exposure time. Finally, photoresist layer 50 (in FIG. 4) is developed to form a photoresist mask 54 and to expose portions 56 of said electrically conductive material 48 which is disposed over metallic pattern 46 (see FIG. 5). The semiconductive metal oxide layer or indium tin oxide layer 48 now has a metal lift off mask 46 under those areas that are to be removed and a photoresist protective mask 54 over those areas that are to remain. The double masking technique illustrated in FIG. 5 will provide more positive pattern delineation and greater protection to the electrode areas, (areas under the photoresist mask 54) during subsequent critical etching steps.

A number of variations of the process according to the teachings of the present invention, which can readily be understood from the explanation of the scheme of FIGS. 2 through 5 can be made by those skilled in the art to adapt a method to a particular intended use. The process is also suitable for applications other than the preferred preparation of patterned electrodes for electroluminescent display devices. This process can be used in devices which require the deposition of thin films on a substrate, whether they be applied in certain areas or in a pattern, and which comprise a conductive, and preferably transparent, material.

The material used that is ultimately to be patterned on a particular substrate or its thickness or other properties are of importance only with respect to the end use of the product of the process according to the invention, but not with respect to the process itself. In place of the semiconducting oxides of metals such and indium and/or tin, which are typical materials for these conductive layers, other materials can also be used. However, correspondingly thin metal layers can also be optically transparent or translucent that it is to say they have adequate optical transmission, and can be etched in accordance with the teachings of the present invention.

In the embodiment of the present invention, aluminum was preferred as a metal for the metallic layer on the substrate, but the process is not limited to aluminum. With respect to a semiconductive metal oxide material indium tin oxide was preferred. Transparent electrodes made according to the teachings of the present invention, utilizing the double masking structure, will result in more positive delineation of thin film device patterns. In addition, this approach reduces overetching and underetching in a difficult to etch material. Finally, a combination of a lift-off mask and a protective mask will protect the desired pattern while making removal of unwanted material easier resulting in a more reliable process with high yield.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of patterning electrically conductive layers on a substrate, said method comprising the steps of:

providing a substrate having a metallic material patterned thereon;

heating said substrate and depositing a layer of electrically conductive material over said metallic pattern and on said substrate;

depositing a layer of a photoresist composition over said electrically conductive layer and exposing said photoresist layer to ultraviolet light through the side of said substrate opposite said photoresist layer; and developing said photoresist layer to form a photoresist mask and to expose portions of said conductive material disposed over said metallic pattern.

2. The method according to claim 1 wherein said substrate is made of an optically transparent material.

3. The method according to claim 1 wherein said metallic material includes aluminum.

4. The method according to claim 1 wherein said electrically conductive material includes a semiconductive metal oxide.

5. The method according to claim 4 wherein said metal oxide includes indium tin oxide.

6. The method according to claim 1 wherein said step of providing said substrate with said pattern includes the steps of:

providing an optically transparent substrate coated with a layer of a metallic material layer; coating said metallic layer with a layer of a photoresist composition;

exposing to ultraviolet light and developing said photoresist layer to form a photoresist mask and to expose portions of said metallic layer; and etching said exposed metallic portions and removing said photoresist mask, resulting in a metallic pattern on said substrate.

7. A method of patterning electrically conductive layers on a substrate, said method comprising the steps of:

providing an optically transparent substrate coated with a layer of metallic material;

coating said metallic layer with a layer of a photoresist composition;

exposing said photoresist layer to ultraviolet light and developing said photoresist layer to form a photoresist mask and to expose portions of said metallic layer;

etching said exposed metallic portions and removing said photoresist mask, resulting in a metallic pattern on said substrate;

heating said substrate and depositing a layer of an electrically conductive material on said substrate and over said metallic pattern;

depositing a layer of photoresist composition over said electrically conductive layer and exposing said photoresist layer to ultraviolet light through the side of said substrate opposite said photoresist layer; and developing said photoresist layer to form a photoresist mask and to expose portions of said electrically conductive material disposed over said metallic pattern.

8. The method according to claim 7 wherein said metallic material includes aluminum.

9. The method according to claim 7 wherein said electrically conductive material includes a semiconductive metal oxide.

10. The method according to claim 9 wherein said metal oxide includes indium tin oxide.

* * * * *